United States Patent
Lam et al.

(10) Patent No.: US 7,829,456 B2
(45) Date of Patent: Nov. 9, 2010

(54) METHOD TO MODULATE COVERAGE OF BARRIER AND SEED LAYER USING TITANIUM NITRIDE

(75) Inventors: Winsor Lam, Daly City, CA (US);
Tza-Jing Gung, San Jose, CA (US);
Hong S. Yang, Pleasanton, CA (US);
Adolph Miller Allen, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 12/257,279

(22) Filed: Oct. 23, 2008

(65) Prior Publication Data
US 2010/0105204 A1    Apr. 29, 2010

(51) Int. Cl.
*H01L 21/4763* (2006.01)

(52) U.S. Cl. ........................ 438/629; 438/627; 438/628; 257/E21.584

(58) Field of Classification Search ................. 438/622, 438/625, 627–629, 687; 257/E21.584
See application file for complete search history.

(56) References Cited

U.S. PATENT DOCUMENTS

2002/0142583 A1*   10/2002   Chopra ...................... 438/627

* cited by examiner

*Primary Examiner*—Thanhha Pham
(74) *Attorney, Agent, or Firm*—Alan Taboada; Moser IP Law Group

(57) ABSTRACT

Methods for processing substrates are provided herein. In some embodiments, a method for processing substrates includes providing to a process chamber a substrate comprising an exposed dielectric layer having a feature formed therein. A mask layer comprising titanium nitride may be selectively deposited atop corners of the feature. A barrier layer may be selectively deposited atop the mask layer and into a bottom portion of the feature. The barrier layer deposited on the bottom portion of the feature may be etched to redistribute at least a portion of the barrier layer onto sidewalls of the feature.

20 Claims, 7 Drawing Sheets

METHOD TO MODULATE COVERAGE OF BARRIER AND SEED LAYER USING TITANIUM NITRIDE

BACKGROUND

1. Field

Embodiments of the present invention generally relate to substrate processing and, more particularly, to methods of processing substrates via physical vapor deposition (PVD).

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components. As the dimensions decrease, processing of the integrated chip substrates become increasingly more challenging.

For example, in conventional substrate processing, thin layers of material are applied to the inner surfaces of substrate features prior to filling the feature with conductive material. Ideally, the thin layer would be uniform throughout the feature, with minimal overhang (excessive material on surfaces proximate the opening of the feature), which can reduce the size of the feature opening, or close the opening completely (undesirably leaving an air gap trapped within the feature).

Typical processes commonly used for fabricating integrated circuits having features with a high aspect ratio (e.g., of the height of the feature to the width of the feature) include depositing material in a bottom of the features and re-sputtering the material to facilitate redistribution from the bottom to the sidewalls of the feature. This is done using high energy ions directed toward the substrate. Unfortunately, this method causes damage to the underlying layers and to the substrate itself, particularly at the corners, or bevel, and bottom of the feature. This results in significant line resistance increase and reliability degradation. As the dimensions of the integrated circuit components decrease, the aspect ratio increases, which further increases the above problems.

Therefore, there is a need in the art for improved methods for processing substrates.

SUMMARY

Methods for processing substrates are provided herein. In some embodiments, a method for processing substrates includes providing to a process chamber a substrate comprising an exposed dielectric layer having a feature formed therein. A mask layer comprising titanium nitride may be selectively deposited atop corners of the feature. A barrier layer may be selectively deposited atop the mask layer and into a bottom portion of the feature. The barrier layer deposited on the bottom portion of the feature may be etched to redistribute at least a portion of the barrier layer onto sidewalls of the feature.

In some embodiments, a computer readable medium, having instructions stored thereon which, when executed by a controller, causes a process chamber having a substrate disposed therein to be processed by a method, wherein the substrate comprises an exposed dielectric layer having a feature formed therein. A mask layer comprising titanium nitride may be selectively deposited atop corners of the feature. A barrier layer may be selectively deposited atop the mask layer and into a bottom portion of the feature. The barrier layer deposited on the bottom portion of the feature may be etched to redistribute at least a portion of the barrier layer onto sidewalls of the feature.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

Figure 1:
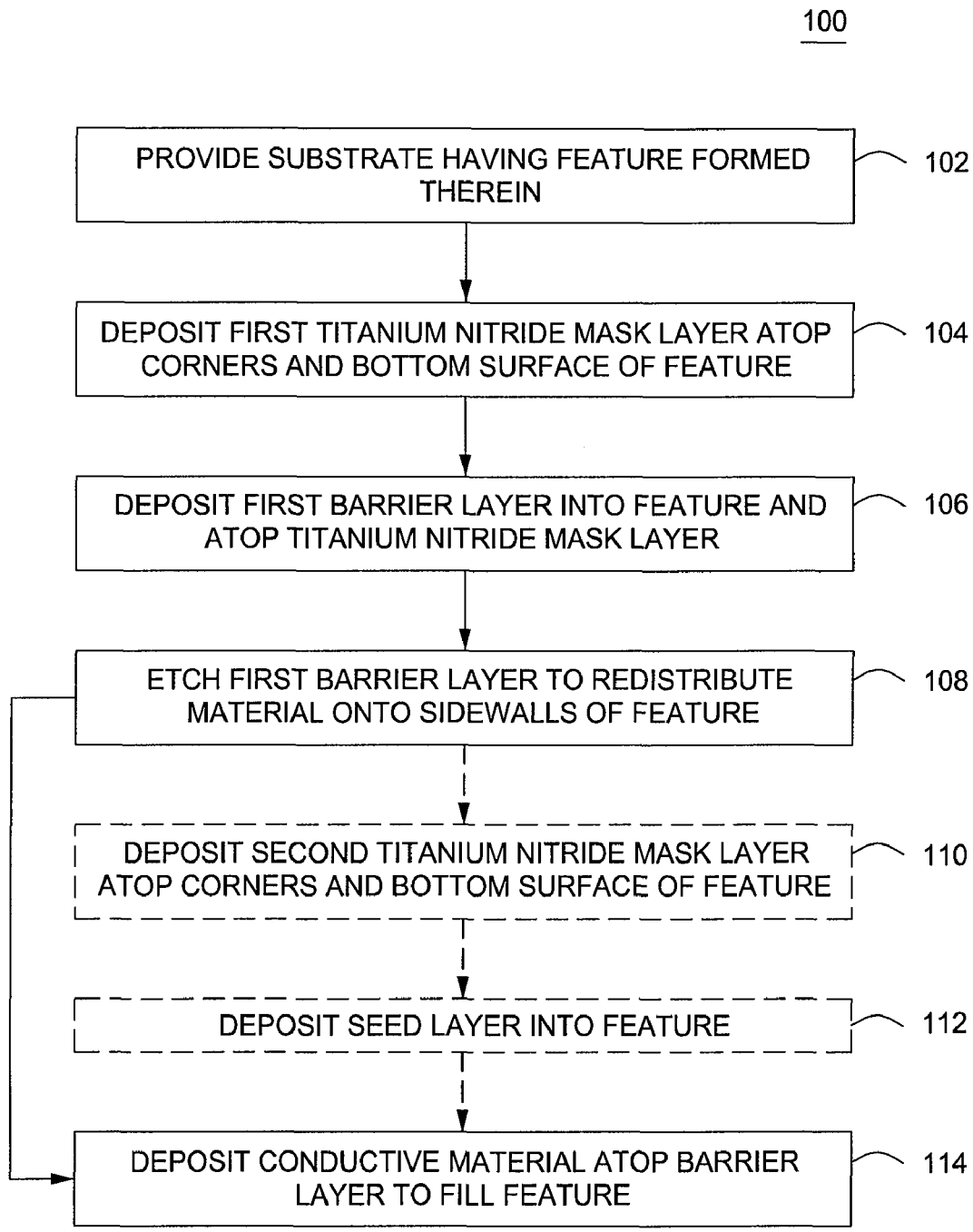
FIG. 1 depicts a method for processing substrates in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention generally relate to methods of protecting substrate features during high energy processes. The inventive methods advantageously reduce damage to substrate features during, for example, high-energy PVD processes, by utilizing a selectively deposited titanium nitride mask layer to protect vulnerable areas where sputter etch is not desired. The inventive methods may advantageously reduce line resistivity and opportunity for electromigration, thus increasing the reliability of the finished devices.

FIG. 1 depicts a method 100 for processing of substrates in accordance with some embodiments of the present invention. FIGS. 2A-2E and 3A-3C are illustrative cross-sectional views of a substrate during different stages of the processing sequence depicted in FIG. 1, in accordance with some embodiments of the present invention. The above method may be performed in any apparatus suitable for processing semiconductor substrates in accordance with embodiments of the present invention, such as discussed below with respect to FIG. 4. To best understand the invention, the reader should refer simultaneously to all figures.

Figure 2A:
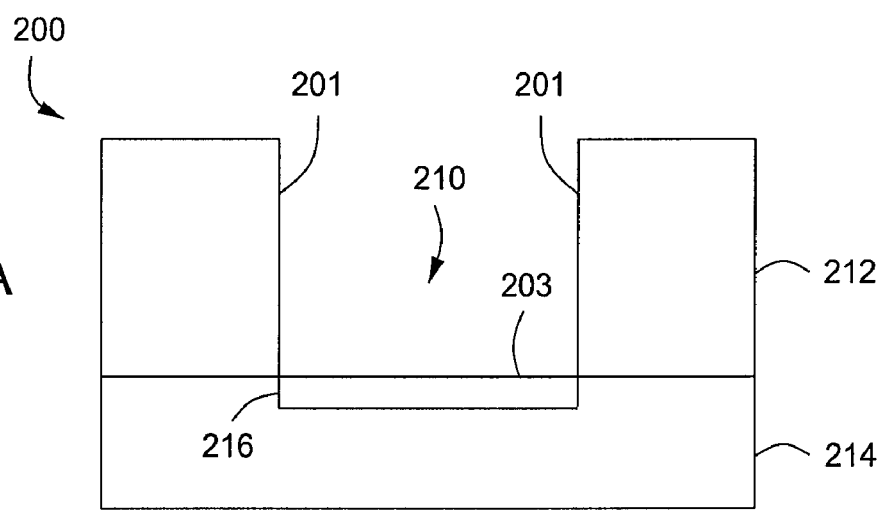
FIGS. 2A-E are illustrative cross-sectional views of a substrate during different stages of processing in accordance with some embodiments of the present invention.

The method 100 begins at 102, where a substrate 200 is provided comprising an exposed dielectric layer 212 having a feature 210 formed therein, as depicted in FIG. 2A. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer (e.g., a 200 mm, 300 mm, or the like silicon wafer).

In some embodiments, the dielectric layer 212 may be formed over a dielectric layer 214. A conductive feature 216 may be formed in an upper region of the dielectric layer 214 such that an upper surface of the conductive feature 216 may be exposed by the feature 210 formed in the dielectric layer 212. For example, a via/trench etching process may be performed to define the feature 210 in the dielectric layer 212, thereby exposing an upper surface of the conductive feature 216. The conductive feature 216 may be fabricated from any suitable conductive material. For example, for a copper interconnect, the conductive feature 216 may be a copper layer embedded in the dielectric layer 214. In some embodiments, the conductive feature 216 may be fabricated from a metal, such as copper, aluminum, tungsten, or the like, alloys thereof, or combinations thereof.

The dielectric layer 212 and the dielectric layer 214 may be fabricated from the same or different materials. In some embodiments, the dielectric materials may comprise silicon oxide ($SiO_2$), silicon nitride (SiN), a low-K material, or the like. The low-k material may be carbon-doped dielectric materials (such as carbon-doped silicon oxide (SiOC), BLACK DIAMOND® dielectric material available from Applied Materials, Inc. of Santa Clara, Calif., or the like), an organic polymer (such as polyimide, parylene, or the like), organic doped silicon glass (OSG), fluorine doped silicon glass (FSG), or the like. As used herein, low-k materials are materials having a dielectric constant less than about that of silicon oxide, which is about 3.9.

The feature 210 is generally defined by sidewalls 201 and bottom surfaces 203. For example, the feature 210 may be a via, a trench, a dual damascene feature, or the like, and may be formed through any suitable process such as an etch process. Although shown as a single feature, multiple features may be simultaneously processed in accordance with the teachings disclosed herein. Although the feature 210 may generally have any dimensions, in some embodiments, the feature 210 is a high aspect ratio feature. For example, in some embodiments, the feature may have a ratio of a height of the feature to a width of the feature of at least about 4:1. In some embodiments, the feature 210 may have a width of less than about 45 nm. The substrate 200 may also include different and/or additional material layers. In addition, other features, such as trenches, vias, or the like, may be formed in one or more layers of the substrate 200.

Figure 2B:
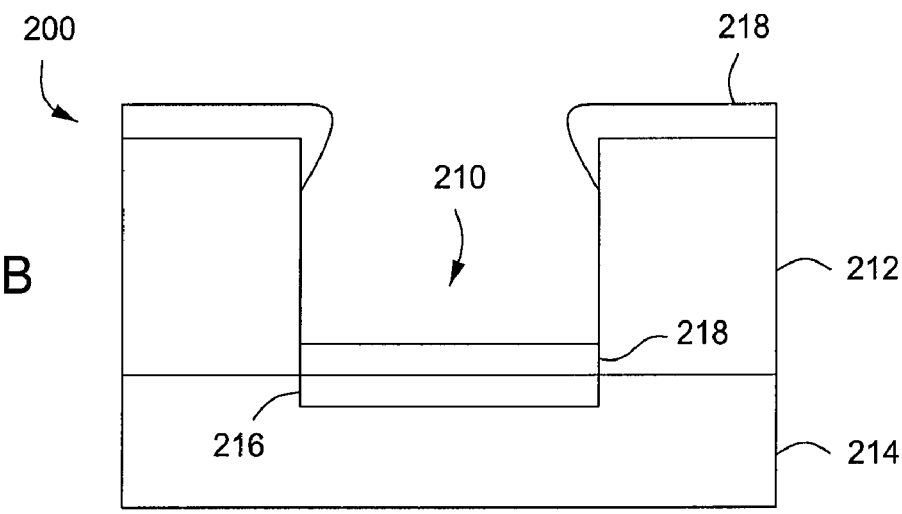
Figure 5A:
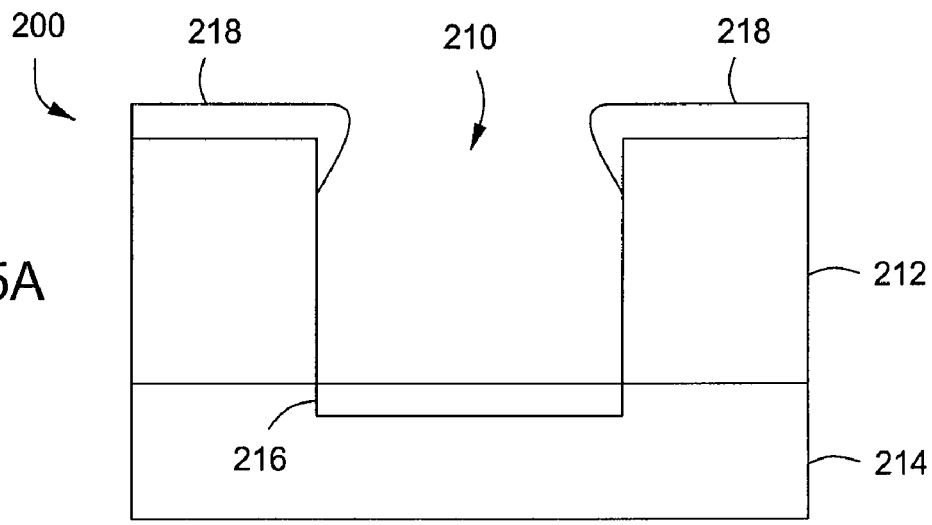
FIGS. 5A-D are illustrative cross-sectional views of a substrate during different stages of processing in accordance with some embodiments of the present invention.

Next, at 104, a titanium nitride mask layer 218 may be selectively deposited atop portions of the substrate 200 that are desired to be protected. For example, in some embodiments, the titanium nitride mask layer 218 may be selectively deposited atop the substrate including the corners and bottom surface of the feature 210, as depicted in FIG. 2B. In some embodiments, the titanium nitride mask layer 218 may be selectively deposited predominantly atop the upper surfaces of the substrate, including the corners of the feature 210, with little or no deposition on the bottom surface of the feature 210, as depicted in FIG. 5A. Due to the low sputter yield of titanium nitride (TiN) as compared to typical barrier and seed metals (e.g., titanium (Ti), tantalum (Ta), aluminum (Al), copper (Cu), and the like), the titanium nitride mask layer 218 acts as an etch inhibitor to protect the structure (e.g., the feature 210) from bevel damage during high ion energy processes while enabling complete removal of metal at the bottom of the feature 210 (for example, a via or trench) and redistributing the material to the sidewall of the feature 210.

Thus, the titanium nitride mask layer 218 facilitates protecting the corners and bottom surface of the feature 210 during the subsequent deposition and etch processes, as discussed below. In some embodiments, the titanium nitride mask layer 218 may have a thickness of between about 30 to about 200 Å. The thickness of the titanium nitride mask layer 218 may be scaled accordingly dependent upon feature size.

The titanium nitride mask layer 218 may be deposited via a PVD process in a suitable process chamber, such as the process chamber 400 described below with respect to FIG. 4, having a target comprising a titanium source material. In some embodiments, the titanium nitride mask layer 218 may be deposited by providing a deposition gas mixture comprising a nitrogen containing gas into the process chamber 400 to react with titanium source metal from the target 442. The reaction causes the target to eject atoms of the target material, which are then directed towards the substrate 200.

In some embodiments, the nitrogen containing gas is nitrogen ($N_2$). In some embodiments, the nitrogen containing gas may be provided at a flow rate of between about 5 to about 200 sccm. In some embodiments the deposition gas mixture may also include an inert gas, such as argon (Ar). The inert gas may be provided at a flow rate of between about 4 to about 200 sccm. In some embodiments, the pressure within the process chamber 400 may be maintained at between about 0.5 mT and about 75 mT.

For a metallic cathode deposition process (e.g., where the nitrogen containing gas does not form titanium nitride directly on the target) having a high deposition rate, the nitrogen containing gas flow may be between about 45 to about 75 sccm. The resulting titanium nitride mask layer 218 may have a low resistivity in the range of between about 50 to about 80 micro ohm-cm. A normalized etch rate on this film may be about 2.5 times the etch rate of a pure titanium (Ti) film.

For a poisoned cathode deposition process (e.g., where the nitrogen containing gas forms titanium nitride directly on the target) with low deposition rate, the nitrogen containing gas flow may be between about 75 to about 200 sccm. The resulting titanium nitride mask layer 218 may have a higher resistivity in the range of between about 90 to about 250 micro ohm-cm, depending on the substrate temperature. A normalized etch rate on this film may be about 4 times that of a pure titanium (Ti) film.

In some embodiments, a source power may be applied to the target 442 during processing to maintain a plasma formed from the deposition gas mixture. In some embodiments, the source power may comprise a DC power of up to about 60 Kw, or in some embodiments, about 40 Kw. The DC power may be varied throughout the process to facilitate selective deposition of the titanium nitride mask layer 218. Alternatively, in some embodiments, an RF signal may be supplied at a power up to about 2 kW at a frequency of between about 2 MHz to about 60 MHz, or in some embodiments, about 13.56 Mhz.

In some embodiments, to facilitate selective deposition of the ejected atoms of the target material on the substrate 200, a bias power in the form of RF power may be applied to the substrate support pedestal 452. In some embodiments, up to about 2000 W of RF power may be supplied at a frequency of between 2 to about 60 MHz, or in some embodiments, about 13.56 MHz. Alternatively, two RF power sources 456, 456A may be utilized, providing a dual frequency substrate bias. Up to about 2000 W of RF power of a first RF bias signal may be provided at a frequency of between about 2 to about 60 MHz. Up to about 2000 W of RF power of a second RF bias signal may be provided at a frequency of between about 2 to about 60 MHz. In some embodiments, for protection of via facets with little or no titanium nitride mask layer 218 deposited at the bottom of the via (such as depicted in FIG. 5A), a low DC power and zero substrate bias power may be utilized. Alternatively, for dual damascene features where lower trench facet protection is desired, a higher DC power and some substrate bias may be utilized to facilitate more complete coverage of the titanium nitride mask layer 218 being deposited (such as in FIG. 2A).

Figure 2C:
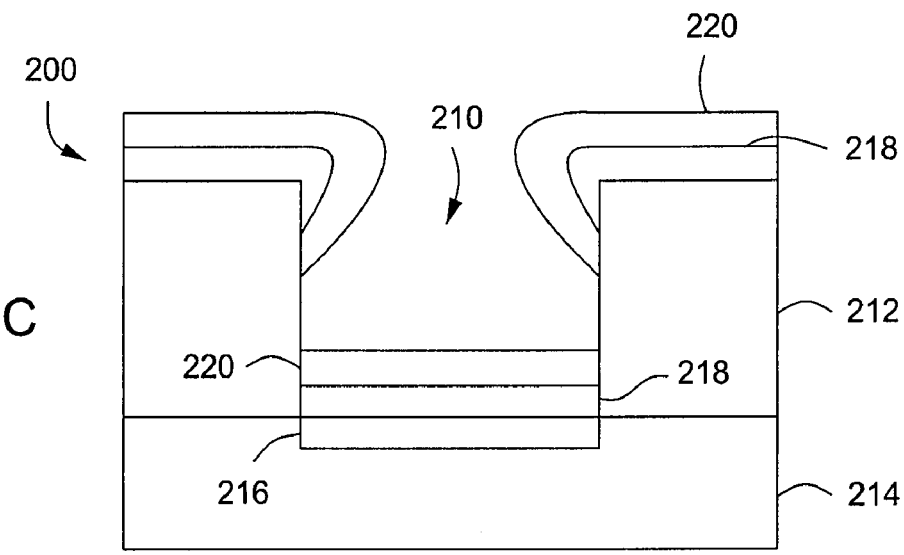
Figure 5B:
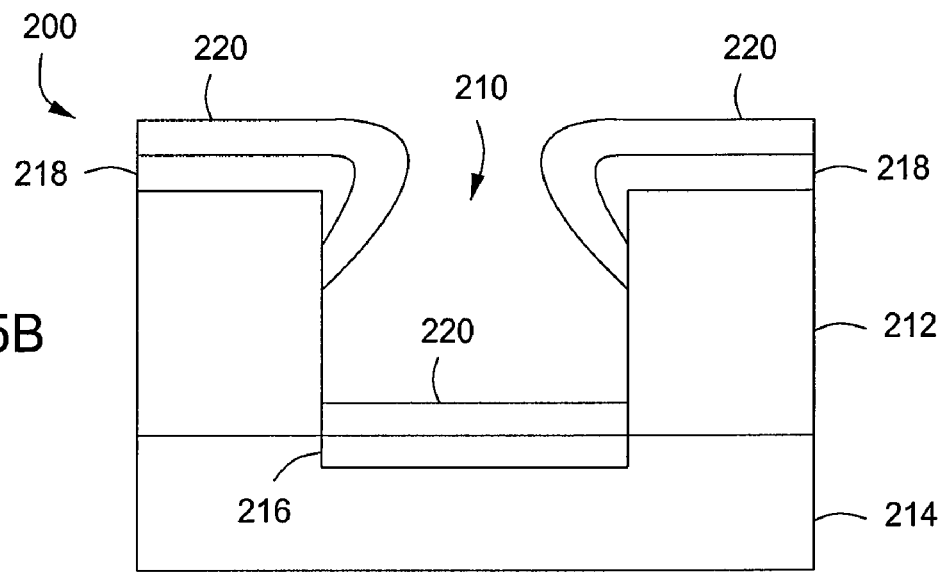

Next, at 106, a barrier layer 220 is deposited atop the titanium nitride mask layer 218 and into the substrate feature 210, as depicted in FIGS. 2C and 5B. The barrier layer 220 may be deposited to a thickness that provides sufficient coverage of the bottom surface of the feature 210 to allow for the subsequent etching and redistribution of the barrier layer 220 from the bottom surface onto the sidewalls of the feature 210. In some embodiments, the barrier layer deposited on the bottom surface of the substrate feature 210 may comprise up to about 60% of the total barrier layer material deposited during this deposition. In some embodiments, the barrier layer 220 may comprise at least one of titanium (Ti), tantalum (Ta), aluminum (Al), copper, (Cu), cobalt (Co), ruthenium (Ru), alloys thereof, or the like.

The barrier layer 220 may be deposited via a PVD process in a suitable process chamber, such as the process chamber 400 described below with respect to FIG. 4, having a target comprising the material for the barrier layer 220. The process chamber 400 may be a different process chamber or the same process chamber utilized at 104. In some embodiments, depositing the barrier layer 220 may include providing a deposition gas mixture into the process chamber 400 to react with target material from the target 442. The reaction causes the target to eject atoms of the target material, which are then directed towards the substrate 200. In some embodiments, the deposition gas mixture may comprise an inert gas, such as argon, helium, krypton, neon, xenon, or the like. The deposition gas may be provided at a flow rate of between about 5 to about 200 sccm.

In some embodiments, the barrier layer 220 may be deposited in a high bottom coverage process by applying up to 60kW of DC power to the target 442 to maintain a plasma formed from the deposition gas mixture and facilitate sputtering of the target 442 material to the substrate 200. In some embodiments, RF power may be applied to the substrate support pedestal 452 during processing. In some embodiments, up to about 2000 W of an RF signal may be supplied at a frequency of between 2 to about 60 MHz, or about 13.56 MHz.

Figure 2D:
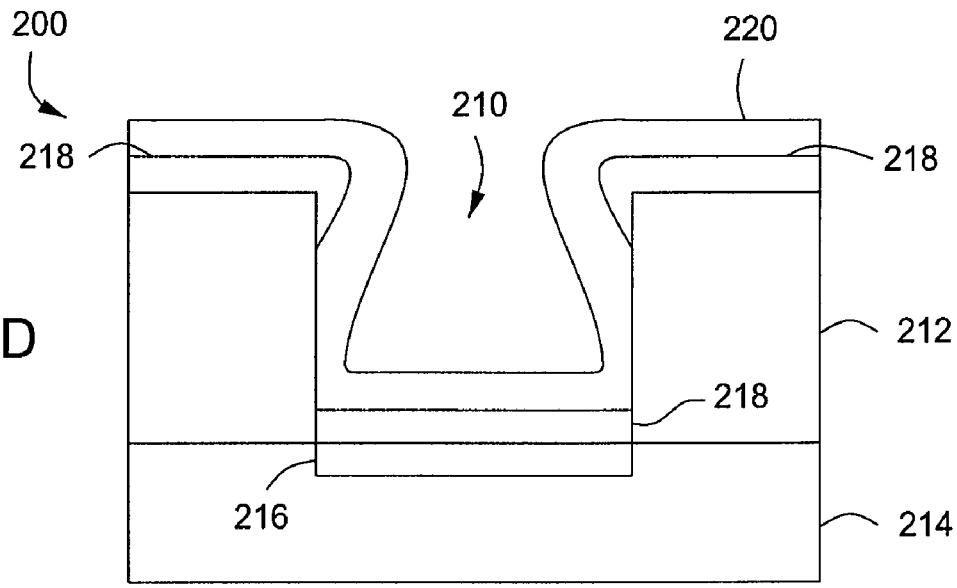
Figure 5C:
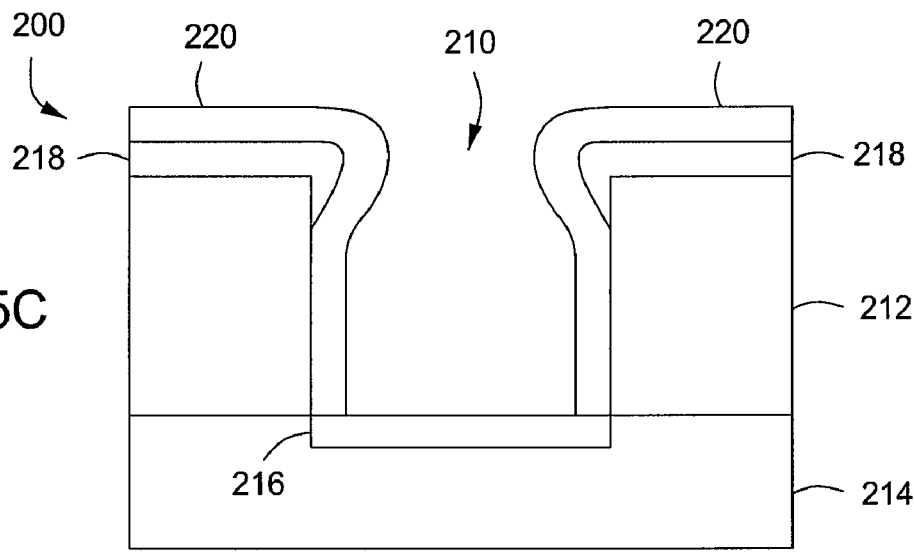

Next, at 108, the barrier layer 220 is etched to redistribute at least a portion of the barrier layer 220 onto the sidewalls of the feature 210, as depicted in FIG. 2D. In some embodiments, the barrier layer 220 may be etched to redistribute substantially all of the barrier layer 220 onto the sidewalls of the feature 210, substantially completely removing the barrier layer 220 and any underlying titanium nitride mask layer 218 from the bottom of the feature 210, as depicted in FIG. 5C. In some embodiments, the etch process is performed by bombarding the substrate with ions from a plasma formed in the process chamber 400, causing the barrier layer 220 to be redistributed. In some embodiments the plasma is formed from an argon containing gas. The argon containing gas may be provided to the process chamber at a flow rate of 200 sccm.

To facilitate etching the barrier layer 220, two RF sources 456, 456A may provide separate substrate bias signals simultaneously. In some embodiments, between about 100 W to about 2 kW of a first RF substrate bias signal having a frequency of about 60 MHz may be provided to facilitate forming the plasma. In some embodiments, between about 50 W to about 2 kW of a second RF substrate bias signal having a frequency of about 2 MHz or 13.56 MHz may be provided to facilitate directing the ions towards the substrate.

Figure 3A:
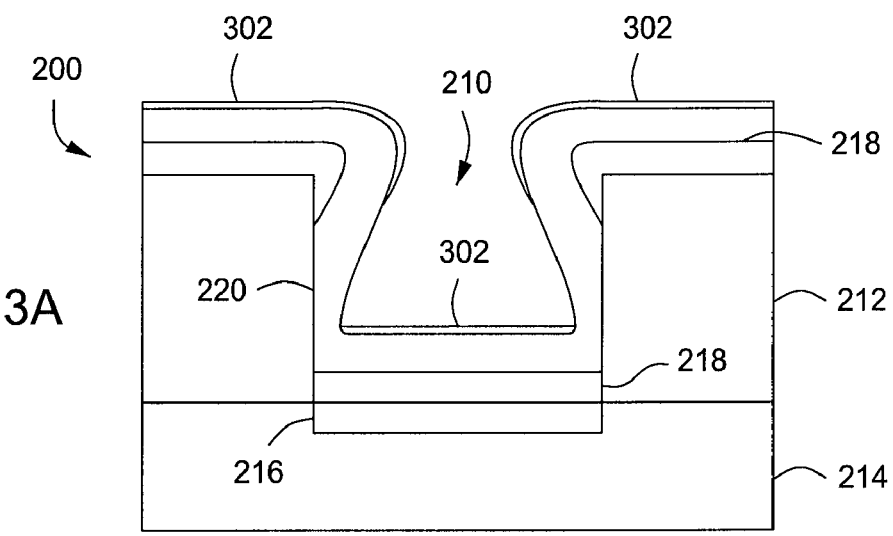
FIGS. 3A-C are illustrative cross-sectional views of a substrate during different stages of processing in accordance with some embodiments of the present invention.
Figure 3B:
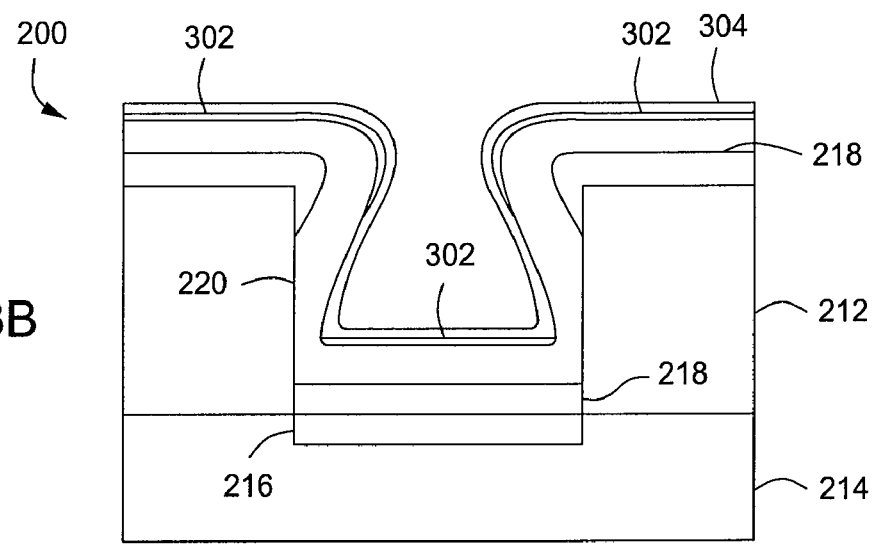
Figure 3C:
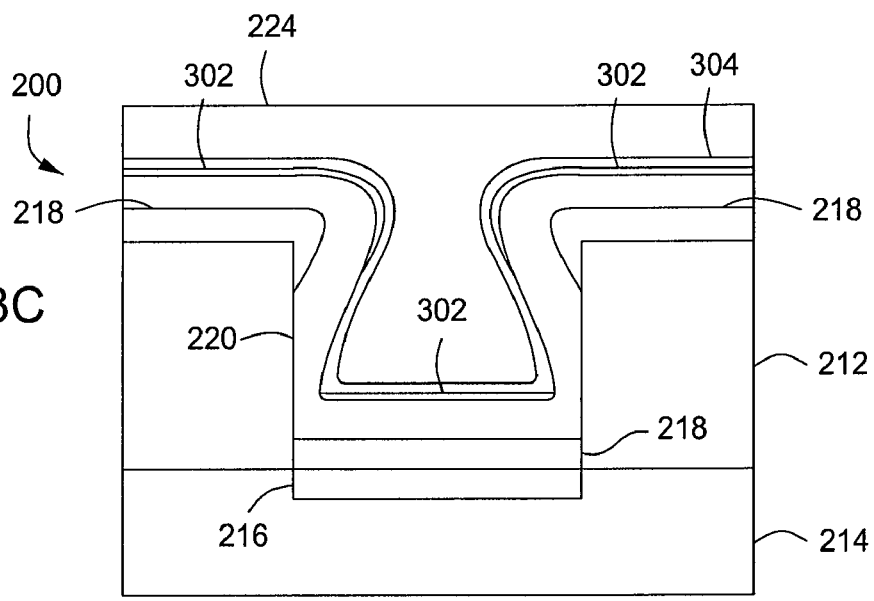

Optionally, and as depicted in FIGS. 3A-C, a second titanium nitride mask layer may be deposited atop the barrier layer 220. For example, a second titanium nitride mask layer 302 may be deposited, at 110, in the same manner as described above with respect to the titanium mask layer 218 (as depicted in FIG. 3A). In some embodiments, a seed layer 304 may be formed over the second titanium nitride mask layer 302, as depicted in FIG. 3B. For example, at 112, a seed layer 304 may deposited into the substrate feature and atop the second titanium nitride mask layer 302 utilizing any suitable process, such as PVD. The seed layer 304 may comprise any suitable material to provide uniform coverage of the surfaces of the feature 210 and to facilitate uniform growth and coverage of a conductive material that is to be deposited into the feature 210, as discussed below. In some embodiments, the seed layer 304 may comprise at least one of aluminum, copper, or the like.

Figure 2E:
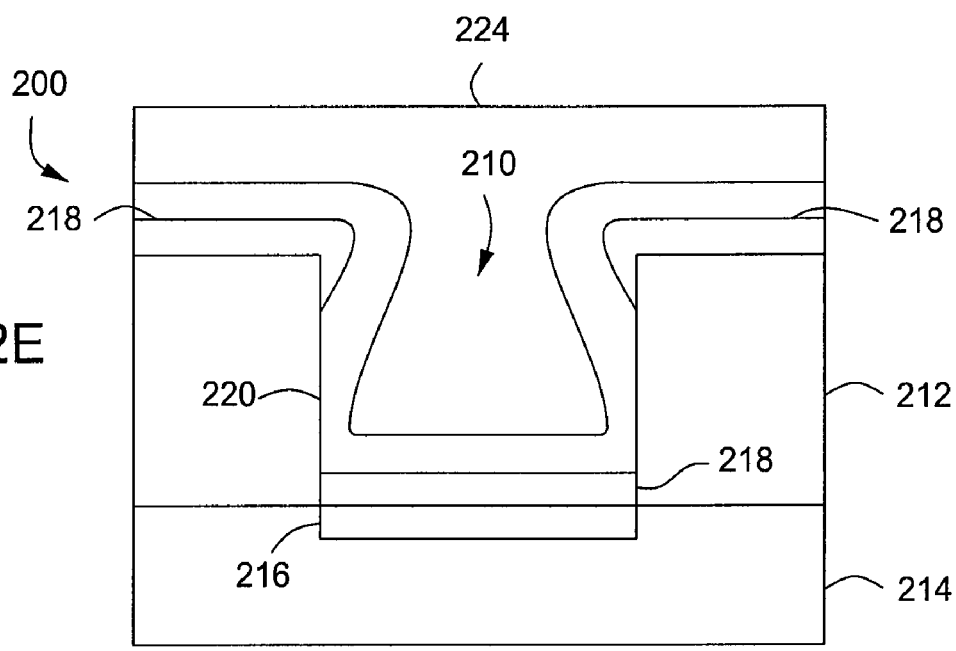
Figure 5D:
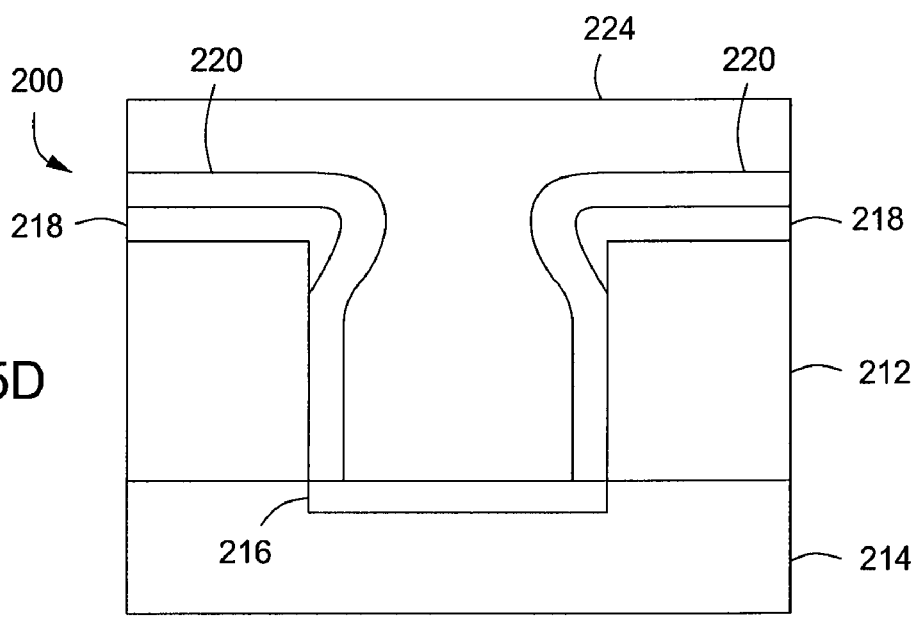

Next, at 114, a conductive material 224 may be deposited atop the barrier layer 220, as depicted in FIG. 2E, atop the seed layer 304, as depicted in FIG. 3C, or atop the barrier layer 220 and the conductive feature 216, as depicted in FIG. 5D, to fill the substrate feature 210. The conductive material 224 may be deposited in any manner such as electrochemical deposition, or plating (ECP), or the like. In some embodiments, the conductive material 224 may be aluminum, copper, tungsten, or the like. In some embodiments, a seed layer (such as seed layer 304 depicted in FIGS. 3B-C) may be deposited atop the barrier layer 220 (or the barrier layer 220 and the conductive feature 216) prior to filling the feature 210 with the conductive material 224. The seed layer may facilitate even growth of the conductive material 224. After filling the feature 210 with the conductive material 224, chemical mechanical polishing (CMP) or other suitable technique may be used to remove the excess conductive material 224 outside the feature 210 (and any other features, such as other vias, trenches, dual damascene structures, or the like). Further metallization levels including additional dielectric layers and metallization structures may then be formed over the filled feature 210.

Upon completion of the deposition of the conductive material 224 at 114, the process ends and the substrate 200 may be further processed as required for a particular application.

The inventive methods described herein may be performed in a PVD chamber as described below. FIG. 4 illustrates one embodiment of a PVD chamber (process chamber 400) in which the invention may be practiced. Examples of suitable PVD chambers include the ENDURA® EXTENSA TTN and ENDURA® ENCORE processing chambers, both commercially available from Applied Materials, Inc., of Santa Clara, Calif. It is contemplated that other processing chambers from other manufactures may also be utilized to perform the present invention.

In some embodiments, the process chamber 400 contains a substrate support pedestal 452 for receiving the substrate 200 thereon, and a sputtering source, such as a target 442. The substrate support pedestal 452 may be located within a grounded enclosure wall 450, which may be a chamber wall (as shown) or a grounded shield (not shown).

The target 442 may be supported on a grounded conductive aluminum adapter 444 through a dielectric isolator 446. The target 442 comprises a material to be deposited on the substrate 200 during sputtering, such as titanium when depositing a titanium nitride mask layer 218 in accordance with embodiments of the present invention.

The substrate support pedestal 452 has a material-receiving surface facing the principal surface of the target 442 and supports the substrate 200 to be processed in planar position opposite to the principal surface of the target 442. The substrate support pedestal 452 may support the substrate 200 in a central region 440 of the processing chamber 400. The central region 440 is defined as the region above the substrate support pedestal 452 during processing (for example, between the target 442 and the substrate support pedestal 452 when in a processing position).

Figure 4:
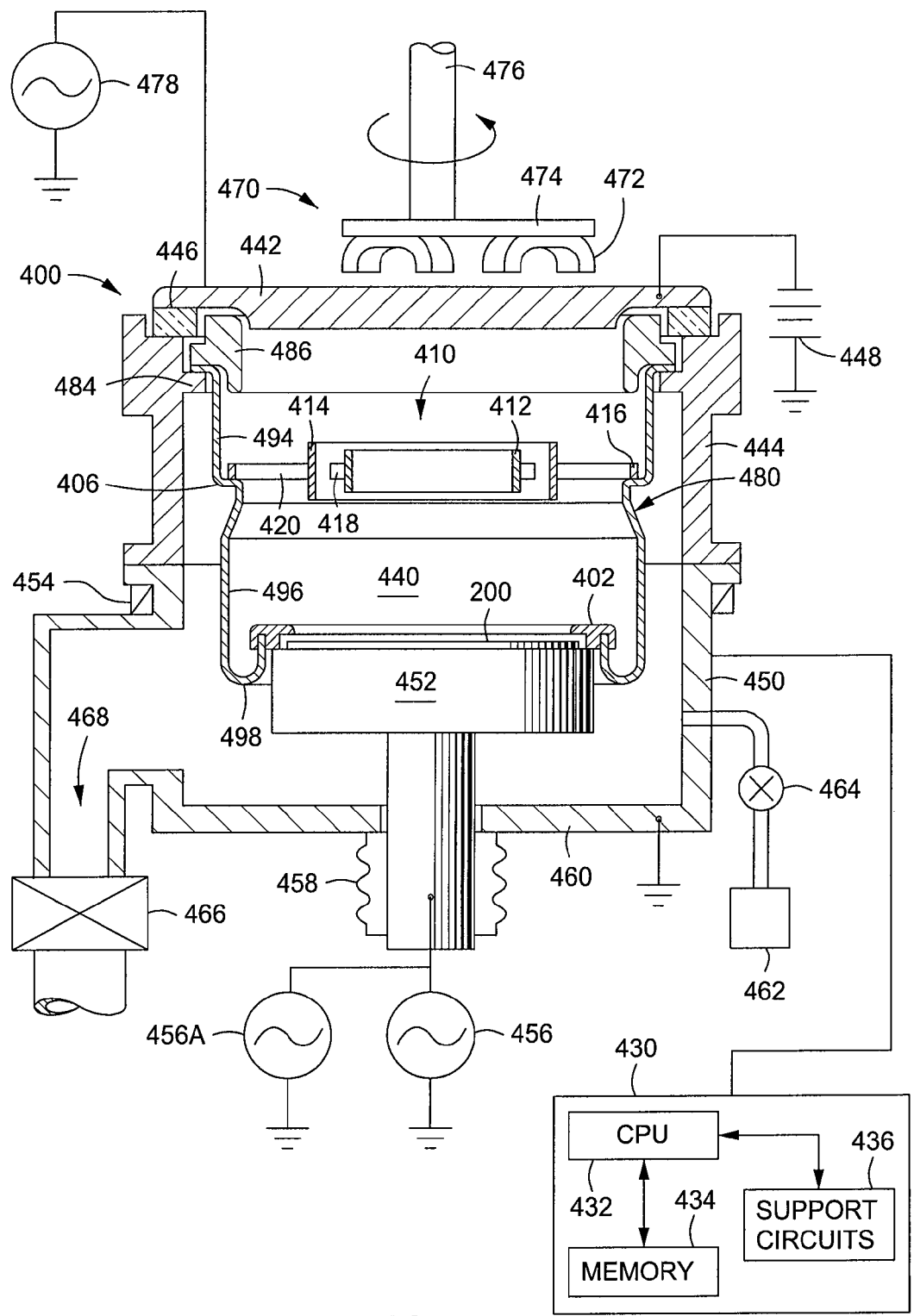
FIG. 4 depicts a schematic side view of an apparatus suitable for processing substrates in accordance with some embodiments of the present invention.

The substrate support pedestal 452 is vertically movable through a bellows 458 connected to a bottom chamber wall 460 to allow the substrate 200 to be transferred onto the substrate support pedestal 452 through a load lock valve (not shown) in the lower portion of processing the chamber 400 and thereafter raised to a deposition, or processing position as depicted in FIG. 4. One or more processing gases may be supplied from a gas source 462 through a mass flow controller 464 into the lower part of the process chamber 400. An exhaust port 468 may be provided and coupled to a pump (not shown) via a valve 466 for exhausting the interior of the processing chamber 400 and facilitating maintaining a desired pressure inside the process chamber 400.

A controllable DC power source 448 may be coupled to the chamber 400 to apply a negative voltage, or bias, to the target 442. In some embodiments, an RF power supply 478 may be coupled to the chamber 400 to induce a bias on the target 442. An RF power supply 456 may be coupled to the substrate support pedestal 452 in order to induce a negative DC bias on the substrate 200. In some embodiments, an additional RF power supply 456A may also be coupled to the substrate support pedestal to facilitate providing a dual frequency substrate bias. In addition, in some embodiments, a negative DC self-bias may form on the substrate 200 during processing. In other applications, the substrate support pedestal 452 may be grounded or left electrically floating.

A rotatable magnetron 470 may be positioned proximate a back surface of the target 442. The magnetron 470 includes a plurality of magnets 472 supported by a base plate 474. The base plate 474 connects to a rotation shaft 476 coincident with the central axis of the chamber 400 and the substrate 200. The magnets 472 produce a magnetic field within the chamber 400, generally parallel and close to the surface of the target 442 to trap electrons and increase the local plasma density, which in turn increases the sputtering rate. The magnets 472 produce an electromagnetic field around the top of the chamber 400, and magnets 472 are rotated to rotate the electromagnetic field which influences the plasma density of the process to more uniformly sputter the target 442. In some embodiments, the magnets can also be arranged to produce a magnetic field which extends to the substrate, which influences the plasma density of the process in a region proximate the substrate to more uniformly resputter the materials on the substrate.

The chamber 400 further includes a grounded bottom shield 480 connected to a ledge 484 of the adapter 444. A dark space shield 486 is supported on the bottom shield 480 and is fastened to the shield 480 by screws or other suitable manner. The metallic threaded connection between the bottom shield 480 and the dark space shield 486 allows the two shields 480, 486 to be grounded to the adapter 444. The adapter 444 in turn is sealed and grounded to the aluminum chamber sidewall 450. Both shields 480, 486 are typically formed from hard, non-magnetic stainless steel. In some embodiments, the shields 480, 486 may contain heating elements for active temperature control. In some embodiments, the shields can be formed from non conducting materials such as ceramic.

The bottom shield 480 extends downwardly in an upper tubular portion 494 of a first diameter and a lower tubular portion 496 of a second diameter. The bottom shield 480 extends along the walls of the adapter 444 and the chamber wall 450 downwardly to below a top surface of the substrate support pedestal 452 and returns upwardly until reaching a top surface of the substrate support pedestal 452 (e.g., forming a u-shaped portion 498 at the bottom). A cover ring 402 rests on the top of the upwardly extending inner portion of the bottom shield 480 when the substrate support pedestal 452 is in its lower, loading position but rests on the outer periphery of the substrate support pedestal 452 when it is in its upper, deposition position to protect the substrate support pedestal 452 from sputter deposition. An additional deposition ring (not shown) may be used to shield the periphery of the substrate 200 from deposition.

The process chamber 400 may also be adapted to provide a more directional sputtering of material onto a substrate 200. In one embodiment, directional sputtering may be achieved by positioning a collimator 410 between the target 442 and the substrate support pedestal 452 to provide a more uniform and symmetrical flux of deposition material to the substrate 200.

The collimator 410 may rest on the ledge portion of the bottom shield 480, thereby grounding the collimator 410. The collimator 410 may be a metal ring and may include an outer tubular section and at least one inner concentric tubular section, for example, three concentric tubular sections 412, 414, 416 linked by cross struts 420, 418. The outer tubular section 416 rests on the ledge portion 406 of the bottom shield 480. The use of the bottom shield 480 to support the collimator 410 simplifies the design and maintenance of the chamber 400. At least the two inner tubular sections 412, 414 are of sufficient height to define high aspect ratio apertures that partially collimate the sputtered particles. Further, the upper surface of the collimator 410 acts as a ground plane in opposition to the biased target 442, which facilitates keeping plasma electrons away from the substrate 200.

In some embodiments, a magnet 454 may be disposed about the chamber 400 for selectively providing a magnetic field between the substrate support pedestal 452 and the target 442. For example, as shown in FIG. 4, the magnet 454 may be disposed about the outside of the chamber wall 450 in a region just above the substrate support pedestal 452 when in processing position. The magnet 454 may be an electromagnet and may be coupled to a power source (not shown) for controlling the magnitude of the magnetic field generated by the electromagnet.

A controller 430 is coupled to various components of the process chamber 400 and comprises a central processing unit (CPU) 432, a memory 434, and support circuits 436 for the CPU 432. The controller 430 may control the substrate processing apparatus 100 directly, or via computers (or controllers) associated with particular process chamber and/or the support system components. The controller 430 may be one of any form of general-purpose computer processor that can be used in an industrial setting for controlling various chambers and sub-processors. The memory, or computer-readable medium, 434 of the CPU 432 may be one or more of readily available memory such as random access memory (RAM), read only memory (ROM), floppy disk, hard disk, flash, or any other form of digital storage, local or remote. The support circuits 436 are coupled to the CPU 432 for supporting the processor in a conventional manner. These circuits include cache, power supplies, clock circuits, input/output circuitry and subsystems, and the like. Inventive methods as described herein may be stored in the memory 434 as software routine that may be executed or invoked to control the operation of the process chamber 400 in the manner described herein. The software routine may also be stored and/or executed by a second CPU (not shown) that is remotely located from the hardware being controlled by the CPU 432.

While the foregoing is directed to embodiments of the present invention, other and further embodiments of the invention may be devised without departing from the basic scope thereof, and the scope thereof is determined by the claims that follow.

The invention claimed is:

1. A method of processing a substrate, comprising:
   providing to a process chamber a substrate comprising an exposed dielectric layer having a feature formed therein, the feature comprising sidewalls of dielectric material;
   selectively depositing a mask layer comprising titanium nitride atop corners of the feature;
   selectively depositing a barrier layer atop the mask layer and into a bottom portion of the feature, wherein the barrier layer directly contacts portions of the sidewalls of the feature; and
   etching the barrier layer deposited on the bottom portion of the feature to redistribute at least a portion of the barrier layer onto the sidewalls of the feature.

2. The method of claim 1, wherein the feature comprises a height to width ratio of at least 4:1.

3. The method of claim 1, wherein depositing the mask layer further comprises:
   providing a titanium (Ti) target in the process chamber;
   supplying a deposition gas into the process chamber, wherein the deposition gas comprises a nitrogen containing gas; and
   sputtering a titanium source material from the titanium (Ti) target in the presence of a plasma formed from the nitrogen containing gas to deposit a titanium nitride layer (TiN) on the substrate.

4. The method of claim 3, wherein the deposition gas further comprises an inert gas.

5. The method of claim 3, wherein supplying the deposition gas into the process chamber further comprises:
   supplying the nitrogen containing gas at a flow rate of between about 5 to about 200 sccm; and
   supplying an argon containing gas at a flow rate of between about 4 to about 200 sccm.

6. The method of claim 3, wherein depositing the mask layer further comprises:
   providing up to about 60 kW of DC power to the titanium (Ti) target.

7. The method of claim 1, wherein depositing the mask layer further comprises depositing the mask layer atop a bottom surface of the feature and wherein depositing the barrier layer into the bottom portion of the feature further comprises depositing the barrier layer atop the mask layer on the bottom surface of the feature.

8. The method of claim 7, wherein depositing the mask layer further comprises:
   providing up to about 2 kW of a substrate bias RF power having a frequency of between about 2 MHz to about 60 MHz.

9. The method of claim 1, wherein depositing the mask layer further comprises:
   providing zero kW of a substrate bias RF power.

10. The method of claim 1, wherein the barrier layer comprises at least one of titanium (Ti), tantalum (Ta), aluminum (Al), copper (Cu), cobalt (Co), ruthenium (Ru), or alloys thereof.

11. The method of claim 1, wherein depositing the barrier layer further comprises:
    providing a target in the process chamber, wherein the target comprises a source material to be deposited;
    supplying a deposition gas comprising an inert gas into the process chamber; and
    sputtering the source material from target in the presence of a plasma formed from the inert gas to deposit a barrier layer of the source material on the substrate.

12. The method of claim 11, wherein depositing the barrier layer further comprises:
    providing up to 60 kW of DC power to the target.

13. The method of claim 1, wherein depositing the barrier layer further comprises:
    providing up to 2 kW of substrate bias power having a frequency of between about 2 MHz to about 60 MHz.

14. The method of claim 1, wherein etching the barrier layer further comprises:
    supplying an argon containing gas into the process chamber; and
    bombarding the barrier layer with ions from a plasma formed from the argon containing gas.

15. The method of claim 1, wherein etching the barrier layer further comprises:
    providing a dual frequency substrate bias.

16. The method of claim 15, wherein providing the dual frequency substrate bias further comprises:
    providing a first RF substrate bias power of between about 100 and 2000 W having a frequency of between about 2 to about 60 MHz; and
    providing a second RF substrate bias power of between 50 to about 2000 W having a frequency of between about 2 to about 60 MHz.

17. The method of claim 1, further comprising:
    depositing a conductive material atop the barrier layer to fill the feature.

18. The method of claim 17, wherein the conductive material is at least one of aluminum or copper.

19. The method of claim 1, further comprising:
    selectively depositing a second mask layer comprising titanium nitride atop the barrier layer.

20. The method of claim 19, further comprising:
    depositing a conductive material atop the second mask layer to fill the feature.

* * * * *